United States Patent [19]

Dickopp et al.

[11] 4,066,976
[45] Jan. 3, 1978

[54] AMPLIFIER WITH VARIABLE GAIN

[75] Inventors: Gerhard Dickopp; Ernst Schröder, both of Hannover, Germany

[73] Assignee: Licentia Patent-Verwaltungs-G.m.b.H., Frankfurt am Main, Germany

[21] Appl. No.: 703,117

[22] Filed: July 6, 1976

[30] Foreign Application Priority Data

July 5, 1975 Germany .................. 2530144

[51] Int. Cl.$^2$ .................. H03F 1/36; H03G 3/20
[52] U.S. Cl. .................. 330/86; 330/51; 330/103; 330/107; 330/109; 330/129
[58] Field of Search .................. 330/9, 35, 51, 85, 86, 330/109, 103, 107, 129; 333/14, 28 T; 328/167

[56] References Cited
U.S. PATENT DOCUMENTS 3,433,937  3/1969  McCarthy .................. 330/103 X
3,667,055  5/1972  Uchida .................. 328/127

Primary Examiner—Lawrence J. Dahl
Attorney, Agent, or Firm—Spencer & Kane

[57] ABSTRACT

An amplifier circuit having a variable transmission factor and an effective transmission frequency band delimited by a lower limit frequency is arranged to enable the value of the lower limit frequency to be varied as a function of a control voltage, by including in the circuit an amplifier member and circuit components defining a feedback path connected between the output of the amplifier and an input thereof which is inverting with respect to the output signals of the amplifier, the components defining the feedback path including an electronically voltage-controllable resistor having a control voltage input and a first frequency dependent impedance connected in parallel with the resistor, and the circuit further including a second frequency dependent impedance connected between the inverting input of the amplifier and a point at the circuit reference potential, and a line for supplying the control voltage to the control voltage input of the controllable resistor.

15 Claims, 7 Drawing Figures

AMPLIFIER WITH VARIABLE GAIN

BACKGROUND OF THE INVENTION

The present invention relates to automatic, dynamic compression/expansion systems, particularly for use in high fidelity sound reproduction equipment.

It is known that the quality of the reproduction of audio frequency performances can be improved by increasing the signal-to-noise ratio by means of a compression-expansion system known as a compander system, in which the useful signals are compressed in amplitude before entering a transmission path subject to interference, e.g. a line or a recording tape, and are expanded after transmission.

Known compander systems employing frequency independent dynamic regulation suffer from the drawback that under certain operating conditions a low frequency, high amplitude sound signal will be unable to cover high frequency interference such as, for example, noise. If such a low frequency, high amplitude sound signal appears, no significant compression will take place due to the high amplitude level. The noise, for example, is then also fully audible. If, on the other hand, the level of the low frequency sound signal drops, the compander effect will start to become apparent, and this results in the further drawback that the noise is modulated in dependence on the level of the low frequency sound signal.

A known system of this type, commonly termed a Dolby system, as disclosed in German Auslegeschrift [Published patent application] No. 14 87 276, is constituted by a compander system having a first signal path for transmitting the useful signal with a linear dynamic characteristic and full bandwidth, and a second signal path for influencing the dynamic characteristic of the useful signal in a certain frequency range, as well as an auxiliary circuit in which the output signals of the two signal paths are combined, the system being arranged to shift the limit frequency of the certain frequency range to higher values with increasing amplitude of the useful signal.

Such an amplitude dependent shift of the limit frequency of that frequency range in which the dynamic regulation takes place suitably serves to substantially prevent the above-mentioned difficulties. In the known circuit, this effect is realized by the use of two series-connected filters, the second filter of which can be controlled with respect to its limit frequency by means of controllable diodes. Two filters, however, involve a relatively large number of components which again makes it more difficult to maintain uniformity in the resulting characteristics when the system is to be mass produced. Moreover, it is not possible with the known circuit to shift the frequency characteristic while maintaining it exactly parallel to its original position, although this would be desirable to overcome the above-mentioned difficulties.

SUMMARY OF THE INVENTION

It is therefore an object of the present invention to overcome the above drawbacks and to make it possible, in a simple manner, to shift the above-mentioned limit frequencies in dependence on amplitude also in such compander systems, inter alia, which have an amplifier with a variable transmission factor, i.e. gain or attenuation factor, in their useful signal path.

These and other objects according to the invention are achieved, in an amplifier circuit having a variable transmission factor and an effective transmission frequency band delimited by a lower limit frequency which can be varied as a function of a control voltage, the circuit including an amplifier member and circuit components defining a feedback path connected between the output of the amplifier and an input thereof which is inverting with respect to the output signals of the amplifier, by the improvement wherein the components defining the feedback path include an electronically voltage-controllable resistor having a control voltage input and a first frequency dependent impedance connected in parallel with the resistor, and the circuit further includes a second frequency dependent impedance connected between the inverting input of the amplifier and a point at the circuit reference potential, and a connection for supplying the control voltage to the control voltage input of the controllable resistor.

The amplifier according to the invention offers the additional advantage that it can also be used as a filter whose limit frequency can be varied as a function of the resistance variation of a controllable resistor.

DESCRIPTION OF THE PREFERRED EMBODIMENTS

Figure 1:
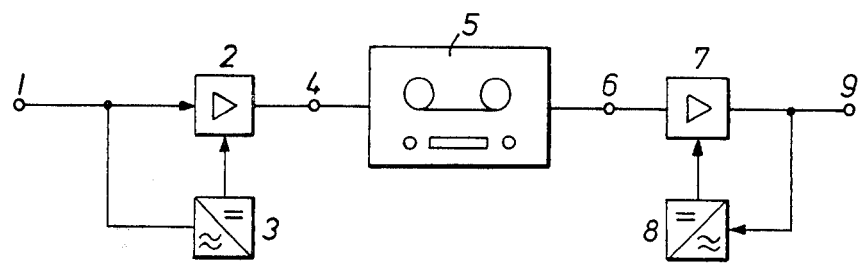
FIG. 1 is a block circuit diagram of a known compander system.

FIG. 1 shows a known compander system, as disclosed in German Offenlegungsschrift [Laid-Open application] No. 22 18 823, in which the audio frequency signals present at input terminal 1 are to be recorded on a tape recorder 5 and in which the thus recorded audio frequency signals available at output terminal 9 for playback are to have as small a content as possible of noise and interference signals originating from tape recorder 5 and from any other instruments connected between terminals 4 and 6.

Figure 2:
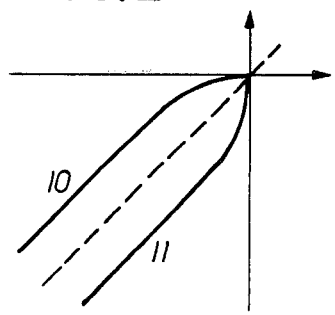
FIG. 2 is a characteristic diagram illustrating the operation of the system of FIG. 1.

The audio frequency signal at input terminal 1 is fed to the signal input of a voltage-controlled variable gain amplifier 2 and to the input of a control voltage generator 3 which, in the simplest case, may be a rectifier and which provides, at its output, a control voltage, that is supplied to the control input of amplifier 2 in order to control the amplifier gain. The above-described arrangement produces the known compression characteristic 10 shown in FIG. 2 so that an audio frequency signal having a reduced, or compressed, dynamic range can be obtained at terminal 4. This audio frequency signal is fed to tape recorder 5 where it is recorded.

During playback of the thus recorded audio frequency signal, this signal is fed via terminal 6 to the signal input of a further voltage-controlled variable gain amplifier 7. The control voltage to be applied to the control input of amplifier 7 is produced in a control voltage generator 8 which may be of the same design as control voltage generator 3. The control characteristic of amplifier 7 is complementary to that of amplifier 2 so that the expansion circuit between terminals 6 and 9 produces the known characteristic 11 shown in FIG. 2. Correspondingly, the input signal originally applied to input terminal 1 appears at output terminal 9 with its original dynamic range and noise and interference signals originating in the components disposed between terminals 4 and 6 are suppressed in a known manner.

Figure 3:
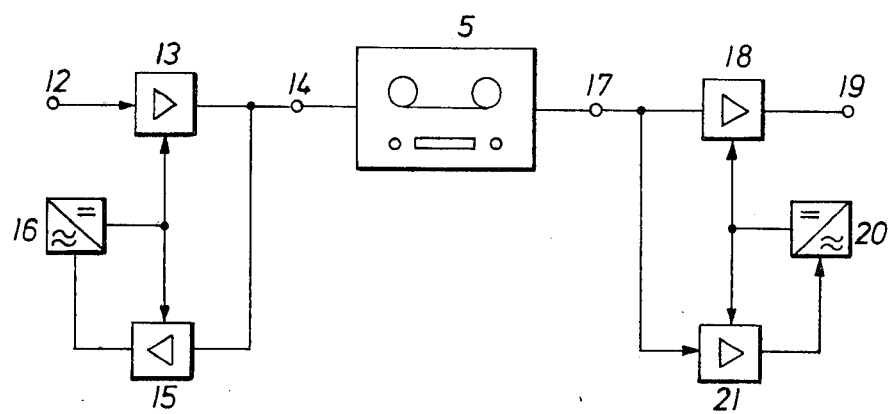
FIG. 3 is a block circuit diagram of another previously proposed compander system which can use the amplifier according to the invention.

Another compander system which has been recently proposed, and disclosed in German Auslegeschrigt [Published patent application] No. 24 06 258 and corresponding U.S. application Ser. No. 543,931, filed Jan. 24th, 1975, is illustrated in FIG. 3. In this system, an audio frequency signal fed to input terminal 12 is fed to the signal input of a voltage-controlled, variable gain amplifier 13. A control voltage generator 16 has its input connected to the output terminal 14 of amplifier 13 via the signal amplifying path of a further voltage-controlled, variable gain amplifier 15, to produce the required control voltage for amplifier 13. The control voltage from control voltage generator 16 controls both amplifiers 13 and 15, whose control characteristics coincide with respect to the polarity, or direction, of their slopes. The above-described circuit produces the dynamic range compression characteristic 22 shown in FIG. 4. This characteristic has the advantage over characteristic 10 of FIG. 2 that it is more accurately reproducible from one device to another due to the fact that the characteristic is constituted by linear sections.

The dynamically compressed audio frequency signal is fed to tape recorder 5 via terminal 14 and is recorded therein. During playback of the thus recorded audio frequency signal, the latter is fed via terminal 17 to the signal input of a third voltage-controlled, variable gain amplifier 18. This amplifier 18 is controlled by a further control voltage generator 20 which receives, via a fourth voltage-controlled, variable gain amplifier 21, the audio frequency signal fed to the input of amplifier 18. The output voltage from control voltage generator 20 controls both amplifiers 18 and 21, the control characteristics of the two amplifiers 18 and 21 in this case being complementary to one another for the purpose of achieving dynamic signal expansion.

Figure 4:
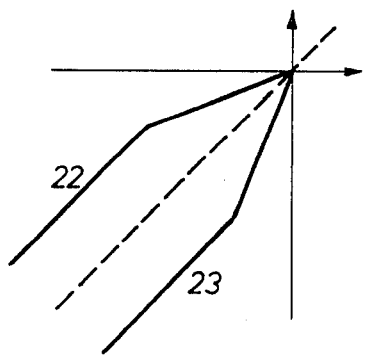
FIG. 4 is a characteristic diagram illustrating the operation of the system of FIG. 3.

The above-described dynamic expansion circuit presents the expansion characteristic 23 shown in FIG. 4 which is complementary to the compression characteristic 22 so that the audio frequency signal appearing at output terminal 19 again has the original dynamic range which it had at input terminal 12. The noise and interference signals introduced in an undesirable manner between terminals 14 and 17 are suppressed.

Figure 5:
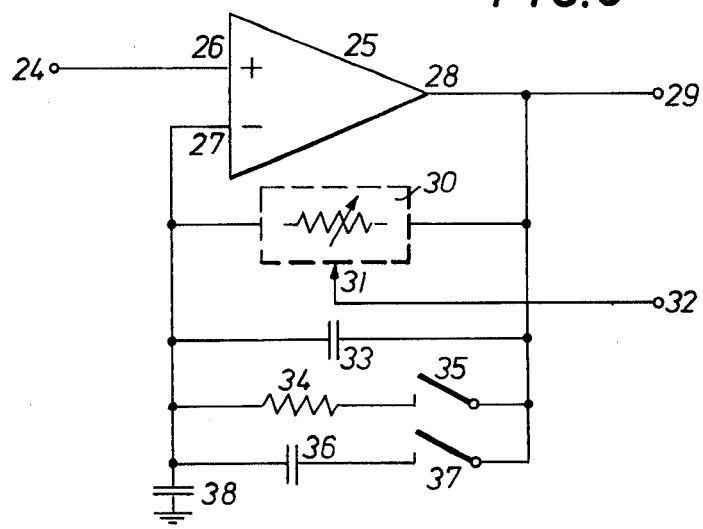
FIG. 5 is a circuit diagram of one preferred embodiment of an amplifier circuit according to the invention.

In accordance with the present invention, the controllable amplifier circuits 2 and 7 of the circuit of FIG. 1 and the controllable amplifier circuits 13, 15, 18 and 21 of the circuit of FIG. 3 can each be constructed in the manner shown in FIG. 5. Whenever certain of these amplifiers must be given a complementary control characteristic, this can be achieved by suitable modification of the auxiliary circuitry, as by employing a control voltage generator whose response characteristic has a complementary slope.

In the amplifier circuit shown in FIG. 5, an input terminal 24 receives the audio frequency signal present, for example, at terminal 1 of FIG. 1 or terminal 12 of FIG. 3, and delivers this signal to the noninverting input 26 of a differential amplifier 25. The output 28 of differential amplifier 25 is connected to an output terminal 29. From the output 28 of differential amplifier 25 a feedback path leads to an inverting input 27 of the differential amplifier 25, the feedback path including the parallel connection of an electronically voltage-controllable resistor 30 and a capacitor 33. The controllable resistor 30 has a control input 31 which receives, via a terminal 32, for example a control voltage to vary the resistance value of resistor 30. This control voltage could be provided by the output of generator 3 of FIG. 1 or generator 16 of FIG. 3. The controllable resistor 30 is advantageously composed of a field effect transistor. A second capacitor 38 is connected between the inverting input 27 of the differential amplifier 25 and ground.

Figure 6:
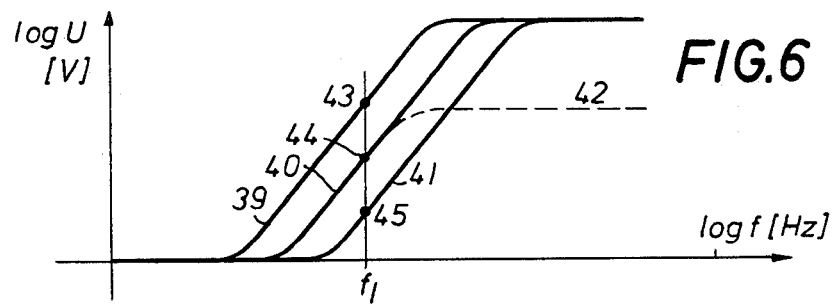
FIG. 6 is a frequency response diagram illustrating the operation of the amplifier of FIG. 5.

The above-described circuit has the frequency response behavior shown in FIG. 6, for example conforming to characteristic 40 which exemplifies the dependence of the output voltage, with respect to a selected constant input voltage, on frequency, both the output voltage and frequency being plotted on a logarithmic scale.

If the resistance value of resistor 30 is varied by varying the voltage at its control input 31, the characteristic 40 of FIG. 6 is shifted along the abscissa, or frequency axis while remaining parallel to its original position. If, for example, the resistance of resistor 30 is increased, characteristic 39 results. If, however, the resistance of resistor 30 is reduced, characteristic 41 results. It can thus be seen that the frequency characteristic of the above-described amplifier circuit can be shifted accurately by the action of the circuitry associated with differential amplifier 25.

The change in gain of the amplifier intended to occur simultaneously with the above-described shift of the limit frequencies is indicated along the line drawn parallel to the ordinate at an arbitrary frequency $f_1$. For frequency $f_1$, the amplitude of the output signal from the amplifier circuit of FIG. 5 changes, with constant input signals and decreasing resistance value for resistor 30, according to the points of intersection 43, 44 and 45 of characteristics 39, 40 and 41 with the above-mentioned line parallel to the ordinate.

When the described amplifier is used in a dynamic compression/expansion system the frequency range in which the limit frequency is shifted reaches from about 200 Hz to about 1500 Hz.

That the above-mentioned shift of the limit frequency of the frequency range in which the gain of the amplifier is variable as shown in FIG. 5 results in an exactly parallel shift of characteristics 39, 40 and 41, can also be seen from the following mathematical equation for the complex gain, G, of the amplifier of FIG. 5:

$$G = \left| \frac{U_{29}}{U_{24}} \right| = \left| \frac{1 + j\omega (C_{33} + C_{38}) \cdot R_{30}}{1 + j\omega C_{38} R_{30}} \right|, \quad (1)$$

where $U_{24}$ is the voltage at input terminal 24 and $U_{29}$ is the voltage at the output terminal 29 of the amplifier of FIG. 5, $R_{30}$ is the resistance value of resistor 30, $C_{33}$ and $C_{38}$ are the capacitances of capacitors 33 and 38, and $\phi$ is the signal frequency in radians/second. The expressions for the poles and zeroes given in the numerator and denominator of the equation, which expressions are simultaneously responsible for the limit frequencies of the characteristics, are exactly proportional to the resistance value $R_{30}$ of resistor 30.

In order to be able to narrow the range over which the characteristic can be shifted in a defined manner, there is further provided a parallel resistor 34 which can be connected in parallel with resistor 30 by the closing of a switch 35. If switch 35 is closed, i.e., provides a conductive path, the characteristic of the described amplifier cannot be shifted in the direction of lower frequencies beyond, for example, the position of characteristic 39, even if the resistance value for resistor 30 approaches zero.

Via a further switch 37, a third capacitor 36 can be connected in parallel with resistor 30 and capacitor 33 so as to vary the amplitude of the transmitting range so that, for example, characteristic 42 which is shown in dashed lines is obtained instead of characteristic 40.

It will be appreciated that the described amplifier can also be used as a filter with an arbitrarily settable characteristic with respect to the limit frequencies and the amplitude of the transmission range.

If instead of differential amplifier 25 a normal, i.e., single input, amplifier is used, it is necessary for the amplifier input to which the feedback path is connected to be in a known manner, an input which is inverting with respect to the output signal of the amplifier, i.e. to use an odd number of inverting stages for a multistage amplifier.

Figure 7:
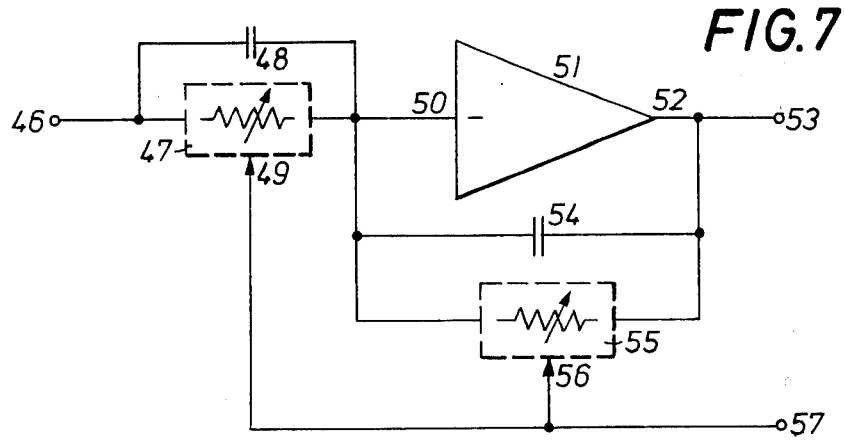
FIG. 7 is a circuit diagram of a further embodiment of an amplifier circuit according to the invention.

An embodiment of such an amplifier is shown in FIG. 7. This amplifier is also suited for use as amplifier 2, 7, 13, 15, 18 or 21 of FIGS. 1 and 3.

The input terminal 46 receives, for example, the audio frequency signal present at terminal 12 of FIG. 3. Terminal 46 is connected, via a parallel circuit composed of a capacitor 48 and a voltage-controllable resistor 47, to the inverting input 50 of amplifier 51. The output 52 of this amplifier 51 is connected to the output terminal 53. Moreover, a feedback path defined by a parallel circuit including a capacitor 54 and a voltage-controllable resistor 55, is connected between output 52 and input 50 of amplifier 51.

The control inputs 49 and 56 of the controllable resistors 47 and 55 are connected to a terminal 57 which receives a control voltage which acts to vary the resistance values of the controllable resistors 47 and 55.

Under control of the resistance values of resistors 47 and 55, the above-described circuit behaves in a manner similar to the circuit of FIG. 5. Characteristics result which are like the characteristics of FIG. 6, i.e. in the circuit of FIG. 7 the characteristics are likewise shifted exactly parallel if there is a change in the resistance values of resistors 47 and 55.

That the characteristics shift, as outlined above, exactly parallel to one another is evident from the equation for the gain, G, of the circuit of FIG. 7, which, based on equation (1) has the following form:

$$G = \left| \frac{U_{53}}{U_{46}} \right| = \left| \frac{1 + j\omega C_{48} R_{47}}{1 + j\omega C_{54} R_{55}} \right| \quad (2)$$

If the resistance values of resistors 47 and 55 have a constant relationship to one another each time with the same control voltage, particularly if they are identical, the shift of the characteristic of FIG. 6 will be exactly parallel.

If the above-mentioned conditions are not met exactly, the resulting set of response characteristics will differ from that shown in FIG. 6.

In order to be able to hold the shift of the frequency response characteristics of the circuit of FIG. 7 within defined limits corresponding to FIG. 6, it is necessary to connect one additional resistor each in parallel with each of resistors 47 and 55, via appropriate switches. The characteristics of the described amplifier can then not be shifted toward lower frequencies, for example, beyond characteristic 39 even, if the resistance value for resistors 47 and 55 approaches zero.

It is moreover possible to connect additional capacitors in parallel with capacitors 48 and 54 via additional switches so that, for example, characteristic 42 which is shown in dashed lines is realized instead of characteristic 40 of FIG. 6.

It will be understood that the above description of the present invention is susceptible to various modifications, changes and adaptations, and the same are intended to be comprehended within the meaning and range of equivalents of the appended claims.

What is claimed is:

1. In an amplifier circuit arranged to be connected in a useful signal path and having a variable transmission factor and an effective transmission frequency band delimited by a lower limit frequency which can be varied as a function of a control voltage, the circuit including an amplifier member and circuit components defining a feedback path connected between the output of the amplifier member and an input thereof which is inverting with respect to the output signals of the amplifier member, the improvement wherein the components defining said feedback path comprise an electronically voltage-controllable resistor having a control voltage input and a first frequency dependent impedance connected in parallel with said resistor, and said circuit further comprises a second frequency dependent impedance connected between the inverting input of said amplifier member and a point at the circuit reference potential, and means for supplying the control voltage to the control voltage input of said controllable resistor.

2. An arrangement as defined in claim 1 wherein said circuit is provided to produce a dynamic compression or expansion of useful signals, and said circuit further comprises a control voltage generator connected for deriving a control voltage from the information signal to be processed and having an output connected to the control voltage input of said controllable resistor for causing the lower limit frequency to be shifted toward higher values with increasing information signal amplitudes.

3. An arrangement as defined in claim 2 wherein said control voltage generator includes a circuit connected for rectifying the alternating voltage signals in the useful signal path.

4. An arrangement as defined in claim 1 wherein said controllable resistor is a field effect transistor whose control electrode constitutes said control voltage input.

5. An arrangement as defined in claim 1 wherein said amplifier member is a differential amplifier.

6. An arrangement as defined in claim 1 further comprising a further frequency dependent impedance, and switch means for selectively connecting said further impedance in parallel with said first frequency dependent impedance.

7. An arrangement as defined in claim 1 further comprising a further resistor, and switch means for selectively connecting said further resistor in parallel with said controllable resistor.

8. An arrangement as defined in claim 1 wherein said frequency dependent impedances are constituted by capacitors.

9. In an amplifier circuit arranged to be connected in a useful signal path and having a variable transmission factor and an effective transmission frequency band delimited by a lower limit frequency which can be varied as a function of a control voltage, the circuit including an amplifier member and circuit components defining a feedback path connected between the output of the amplifier member and an input thereof which is inverting with respect to the output signal of the amplifier member, the improvement wherein the components defining said feedback path comprise a first electronically voltage-controllable resistor having a control voltage input, and a first frequency dependent impedance connected in parallel with said first resistor, and said circuit further comprises a second electronically voltage-controllable resistor having a control input, said second resistor being connected in the useful signal path and to an input of said amplifier member which is inverting with respect to the output signals of said amplifier member, a second frequency dependent impedance connected in parallel with said second resistor, and means for supplying the control voltage to the control voltage inputs of said first and second controllable resistors.

10. An arrangement as defined in claim 9 wherein said frequency dependent impedances are constituted by capacitors.

11. An arrangement as defined in claim 9 wherein, at any given control voltage value, the resistance values of said first and second controllable resistors have a fixed relationship to one another.

12. An arrangement as defined in claim 11 wherein said first and second controllable resistors are constructed to exhibit resistance variation in response to the control voltage applied to their control voltage inputs.

13. An arrangement as defined in claim 9 further comprising a third frequency dependent impedance, switch means connecting said third impedance in parallel with said first resistor, a fourth frequency dependent impedance, and switch means connecting said fourth impedance in parallel with said second resistor.

14. An arrangement as defined in claim 9 further comprising a first additional resistor, switch means connecting said first additional resistor in parallel with said first resistor, a second additional resistor, and switch means connecting said second additional resistor in parallel with said second resistor.

15. An arrangement as defined in claim 14 wherein at any given control voltage value, the resistance values of said first and second controllable resistors have a fixed relationship to one another and the resistance values of said first and second additional resistors have the same relationship to one another as the resistance values of said first and second controllable resistors.

* * * * *